(12) United States Patent
Ahn et al.

(10) Patent No.: US 12,439,587 B2
(45) Date of Patent: Oct. 7, 2025

(54) SEMICONDUCTOR DEVICE HAVING AN AIR GAP SURROUNDING A PORTION OF A CONDUCTIVE CONTACT LAYER

(71) Applicant: SAMSUNG ELECTRONICS CO., LTD., Suwon-si (KR)

(72) Inventors: Junhyeok Ahn, Suwon-si (KR); Kiseok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 473 days.

(21) Appl. No.: 17/953,054

(22) Filed: Sep. 26, 2022

(65) Prior Publication Data

US 2024/0107743 A1    Mar. 28, 2024

(30) Foreign Application Priority Data

Apr. 27, 2022 (KR) ........................ 10-2022-0051998

(51) Int. Cl.
   *H10B 12/00* (2023.01)
(52) U.S. Cl.
   CPC .......... *H10B 12/315* (2023.02); *H10B 12/34* (2023.02); *H10B 12/50* (2023.02)
(58) Field of Classification Search
   CPC .. H10B 12/0335; H10B 12/30; H10B 12/315; H10B 12/34; H10B 12/48; H10B 12/482; H10B 12/485; H10B 12/50; H10D 84/0149; G11C 8/14; G11C 11/4097

USPC ......................................... 257/906, 907, 908
See application file for complete search history.

(56) References Cited

U.S. PATENT DOCUMENTS

| | | |
|---|---|---|
| 8,507,344 B2 | 8/2013 | Kim |
| 9,698,097 B2 | 7/2017 | Lee et al. |
| 10,923,390 B2 | 2/2021 | Yoon |
| 11,114,440 B2 | 9/2021 | Song et al. |
| 11,205,652 B2 | 12/2021 | Lee et al. |
| 12,309,996 B2 * | 5/2025 | Chu ................... H01L 21/7682 |
| 2021/0134803 A1 | 5/2021 | Cho et al. |

FOREIGN PATENT DOCUMENTS

KR    1020060113264 A    11/2006

* cited by examiner

*Primary Examiner* — Hoai V Pham
(74) *Attorney, Agent, or Firm* — Fish & Richardson P.C.

(57) ABSTRACT

A semiconductor device includes; a substrate including an active region including a first region and a second region, a bitline extending in a first direction on the substrate and electrically connected to the first region of the active region, a spacer structure disposed on a side surface of the bitline, a contact structure disposed on a side surface of the spacer structure and electrically connected to the second region of the active region and a data storage structure disposed on the contact structure and electrically connected to the contact structure. The contact structure includes; a conductive contact layer including a first portion and a second portion disposed on the first portion, a barrier layer surrounding the first portion of the conductive contact layer, and an air gap surrounding the second portion of the conductive contact layer.

20 Claims, 17 Drawing Sheets

SEMICONDUCTOR DEVICE HAVING AN AIR GAP SURROUNDING A PORTION OF A CONDUCTIVE CONTACT LAYER

CROSS-REFERENCE TO RELATED APPLICATION

This application claims priority under 35 U.S.C. § 119 to Korean Patent Application No. 10-2022-0051998 filed on Apr. 27, 2022 in the Korean Intellectual Property Office, the subject matter of which is hereby incorporated by reference.

BACKGROUND

1. Field

The inventive concept relates generally to semiconductor devices and methods of manufacture for same.

2. Description of Related Art

Enabled by technological advancements and driven by expanding user demands, contemporary and emerging electronic devices are often smaller in physical size, yet capable of enhanced performance. Accordingly, semiconductor devices incorporated within such electronic devices are more densely integrated and generally capable of enhanced performance. In order to manufacture a very dense (e.g., highly scaled) semiconductor devices, contact technologies providing stable connections to conductive structures with improved electrical characteristics are required.

SUMMARY

Embodiments of the inventive concept provide semiconductor devices exhibiting greater reliability and improved electrical characteristics, as well as improved electrical performance.

According to aspects of the inventive concept, a semiconductor device may include; a substrate including an active region, the active region including a first region and a second region, a bitline extending in a first direction on the substrate and electrically connected to the first region of the active region, a spacer structure disposed on a side surface of the bitline, a contact structure disposed on a side surface of the spacer structure and electrically connected to the second region of the active region, and a data storage structure disposed on the contact structure and electrically connected to the contact structure. The contact structure includes; a conductive contact layer including a first portion and a second portion disposed on the first portion, a barrier layer surrounding the first portion of the conductive contact layer, and an air gap surrounding the second portion of the conductive contact layer.

According to aspects of the inventive concept, a semiconductor device may include; a substrate including an active region, a first bitline extending in a first direction on the substrate and including a first side surface, a second bitline extending in the first direction and including a second side surface facing the first side surface of the first bitline, a first spacer structure covering the first side surface of the first bitline, a second spacer structure covering the second side surface of the second bitline, a contact structure disposed between the first spacer structure and the second spacer structure and electrically connected to a portion of the active region, and a data storage structure disposed on the contact structure and electrically connected to the contact structure. The contact structure includes; a conductive contact layer, a barrier layer surrounding a lower surface and lower regions of side surfaces of the conductive contact layer, a barrier layer including a recessed upper surface, wherein the recessed upper surface is recessed to a level lower than that of a surface of the conductive contact layer, and an air gap disposed on the recessed upper surface of the barrier layer and surrounding upper regions of the side surfaces of the conductive contact layer.

According to aspects of the inventive concept, a semiconductor device may include; a substrate including an active region, wherein the active region includes a first impurity region and a second impurity region separate from the first impurity region, a word line structure crossing the active region on the substrate and extending in a first direction, a bitline disposed on the word line structure, extending in a second direction crossing the first direction, and electrically connected to the first impurity region of the active region, a spacer structure covering a side surface of the bitline, a conductive contact layer electrically connected to the second impurity region of the active region on a first region of a side surface of the spacer structure, an insulating fence disposed on a second region of a side surface of the spacer structure, wherein the insulating fence includes a side surface facing the conductive contact layer, a barrier layer surrounding a lower region of a lower surface and side surfaces of the conductive contact layer, wherein the barrier layer includes an upper surface recessed to a level lower than that of an upper surface of the conductive contact layer to form a recessed upper surface of the barrier layer, a first air gap disposed on the recessed upper surface of the barrier layer, surrounding upper regions of the side surfaces of the conductive contact layer, disposed between the conductive contact layer and the spacer structure, and disposed between the conductive contact layer and the insulating fence, an upper conductive pattern capping an upper portion of the air gap and contacting the upper surface of the conductive contact layer, and a data storage structure disposed on the upper conductive pattern and electrically connected to the upper conductive pattern.

BRIEF DESCRIPTION OF DRAWINGS

The above and other aspects, features, and advantages of the inventive concept will be more clearly understood upon consideration of the following detailed description together with the accompanying drawings, in which.

DETAILED DESCRIPTION

Throughout the written description and drawings like reference numbers and labels are used to denote like or similar elements, components, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

As noted above, FIGS. 1A and 1B are respective plan (or top-down) views of a semiconductor device according to embodiments of the inventive concept; FIG. 2A includes cross-sectional views respectively taken along lines I-I' and II-II' of FIG. 1A; FIG. 2B is a cross-sectional view taken along line of FIG. 1B; and FIGS. 3 to 10 are respective, partially enlarged cross-sectional views of the region 'A' indicated in FIG. 2A according to various embodiments of the inventive concept.

Figure 1A:
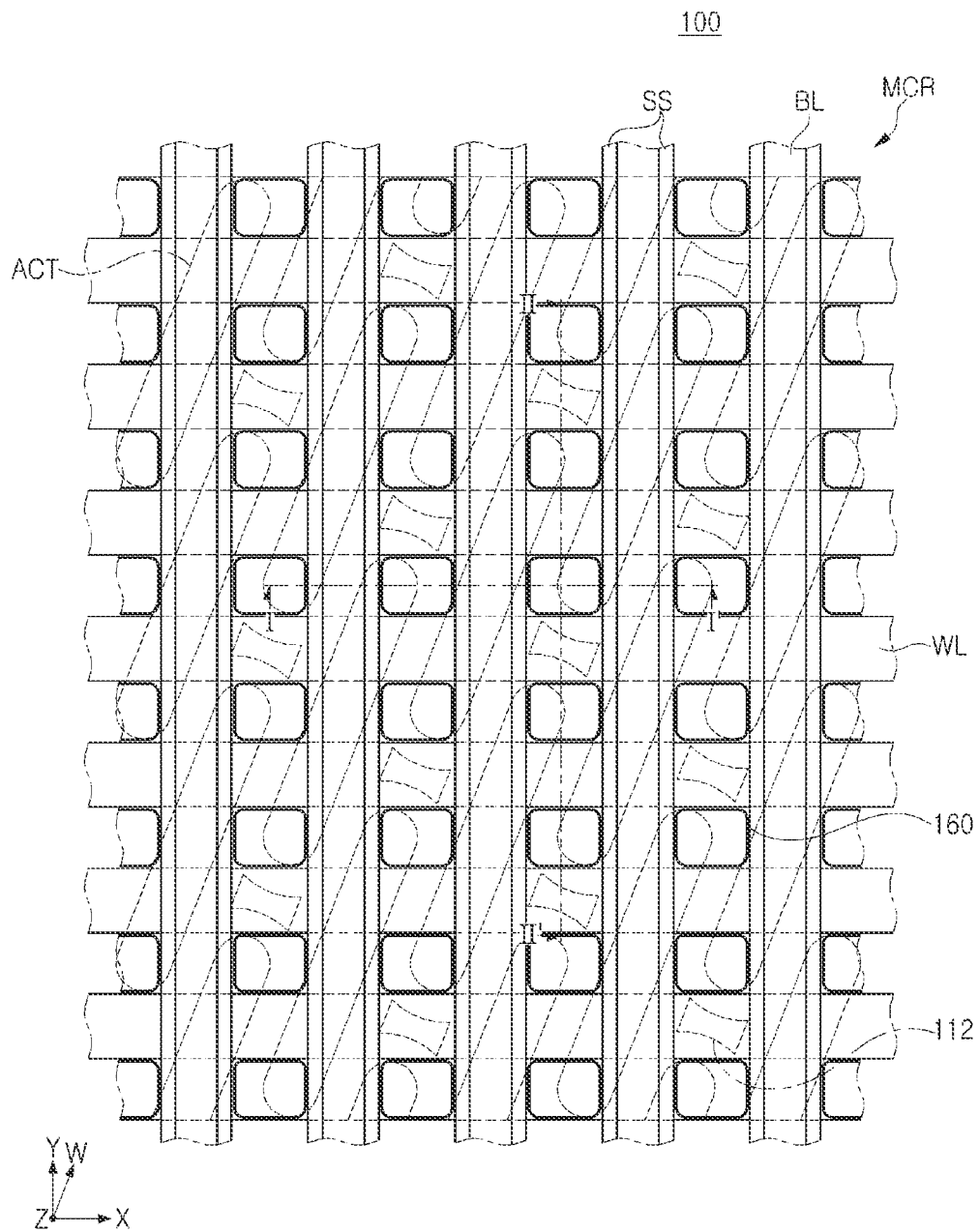
FIGS. 1A and 1B are respective plan (or top-down) views of a semiconductor device according to embodiments of the inventive concept.
Figure 1B:
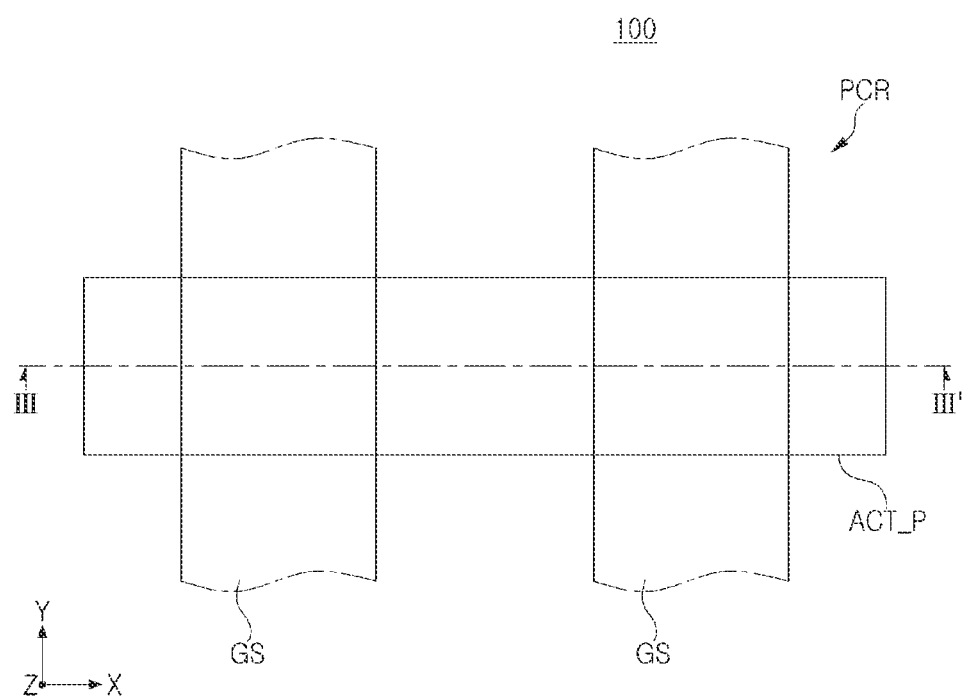
Figure 2A:
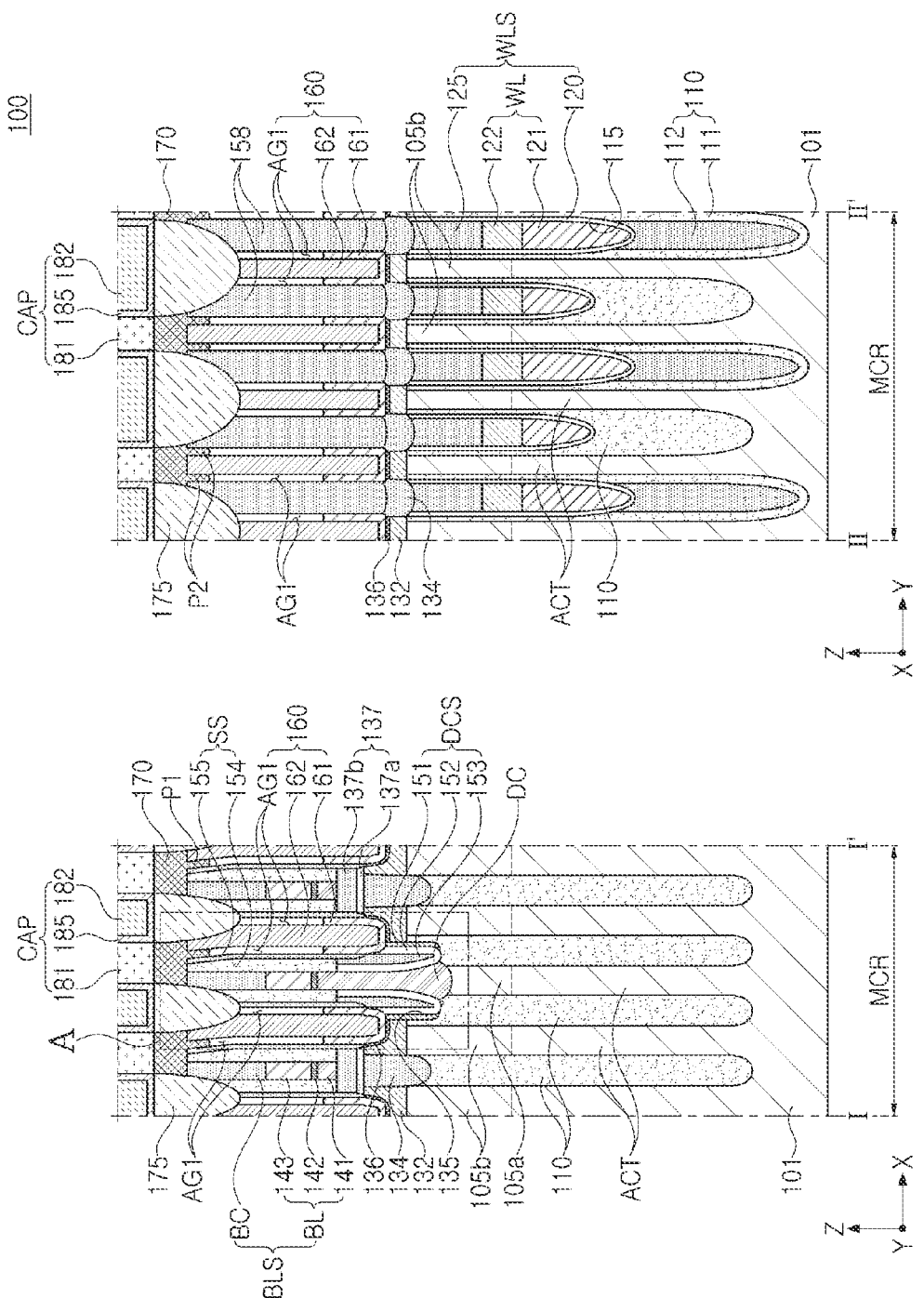
FIG. 2A includes cross-sectional views respectively taken along lines I-I' and II-II' of FIG. 1A.
Figure 2B:
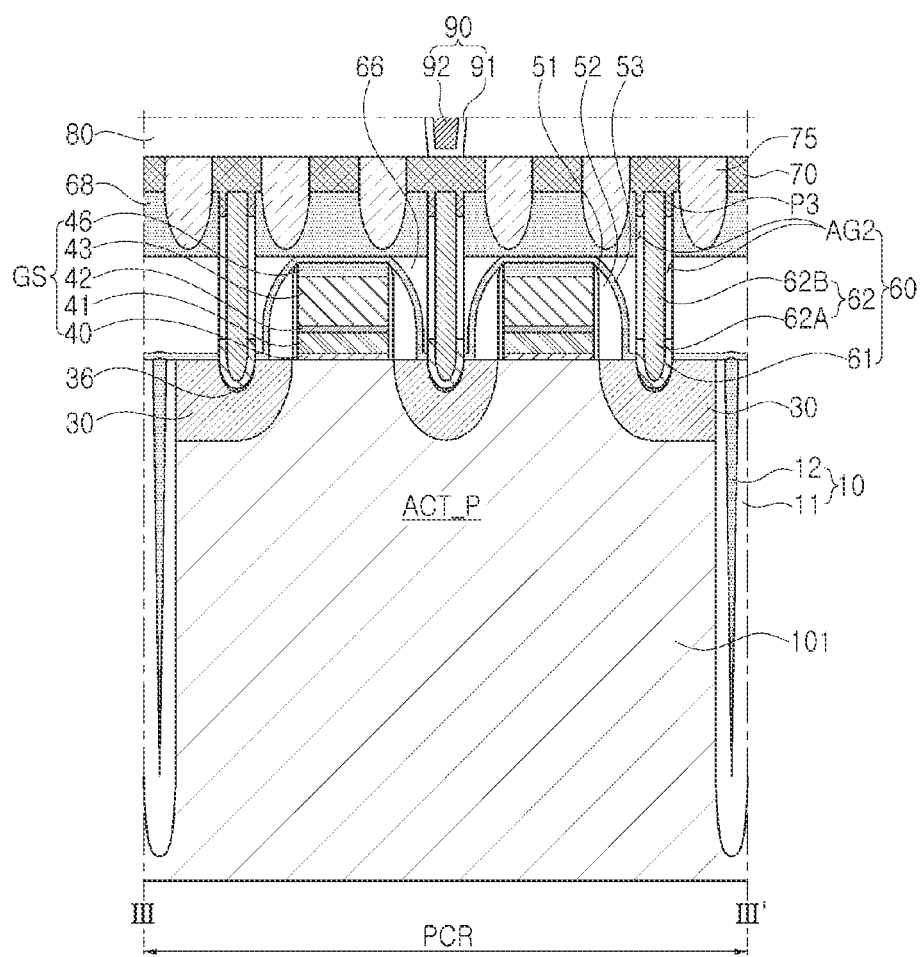
FIG. 2B is a cross-sectional view taken along line III-III of FIG. 1B.

Referring to FIGS. 1A and 1B, a semiconductor device 100 may include a memory cell array region MCR, a peripheral region PCR for driving the memory cell array region MCR. Here, the memory cell array region MCR and the peripheral region PCR may be variously disposed in relation to a substrate (e.g., substrate 101 of FIGS. 2A and 2B).

A word line WL, a bitline BL, a contact structure 160 may be disposed in the memory cell array region MCR. A peripheral active region ACT_P, a peripheral gate structure GS may be disposed in the memory cell array region MCR. The peripheral region PCR may be a region in which a word line driver, a sense amplifier, row and column decoders, and control circuits are disposed. In some embodiments, the peripheral region PCR may be laterally disposed amount the memory cell array region MCR.

Referring to FIGS. 1A, 1B, 2A, 2B and 3, the semiconductor device 100 may include the substrate 101 including active regions ACT, a device separation region 110 defining the active regions ACT, a word line structure WLS downwardly extending to be embedded in the substrate 101 and including a bitline BL, a bitline structure BLS laterally extending to cross the word line structure WLS and including a bitline BL, a spacer structure SS covering a side surface of the bitline structure BLS, a contact structure 160 on a side surface of the spacer structure SS, an insulating fence 158 on a side surface of the contact structure 160, an upper conductive pattern 170 on the contact structure 160, a separation insulating pattern 175 penetrating the upper conductive pattern 170, and a data storage structure CAP on the upper conductive pattern 170.

The semiconductor device 100 may further include pad layers 132 on the active regions ACT, insulating barrier layers 134 separating the pad layers 132, a metal-semiconductor compound layer between the pad layer 132 and the contact structure 160, and a buffer insulating layer 137 between the bitline structure BLS and the insulating barrier layer 134.

The semiconductor 100 may include, for example, a cell array of a dynamic random access memory (DRAM). For example, the word line WL and the active region ACT may constitute a memory cell transistor, wherein the bitline BL may be connected to a first impurity region 105a of the active region ACT, and a second impurity region 105b of the active region ACT may be electrically connected to the data storage structure CAP through the contact structure 160.

The substrate 101 may include one or more semiconductor material(s), for example, a group IV semiconductor, a group III-V compound semiconductor, and/or a group II-VI compound semiconductor. In some embodiments, the group IV semiconductor may include silicon, germanium, or silicon-germanium. The substrate 101 may further include selectively included impurities. In some embodiments, the substrate 101 may be a substrate including a silicon substrate, a silicon-on insulator (SOI) substrate, a germanium substrate, a germanium-on insulator (GOI) substrate, a silicon-germanium substrate, or an epitaxial layer.

The active regions ACT may be limited or defined in the substrate 101 by the device separation layer 110. For example, the active region ACT may have a bar shape, and may be disposed in an island shape extending angularly across the substrate 101 in (e.g.,) a direction W. Here, for example, the direction W may be a direction angled with respect to extension directions for the word lines WL (e.g., a first horizontal direction or an X direction) and the bitlines BL (e.g., a second horizontal direction or a Y direction). Further, in some embodiments, the active regions ACT may be arranged in parallel, such that an end portion of one active region ACT may is laterally adjacent to a center portion of another active region ACT.

The active region ACT may doped with at least one of first type impurities and second type impurities in order to form impurity regions 105a and 105b having a predetermined depth from an upper surface of the substrate 101. Here, the first and second impurity regions 105a and 105b may be spaced apart. The first and second impurity regions 105a and 105b may be connected to a source/drain region of a transistor formed by a word line WL. For example, a drain region may be formed between two adjacent word lines WL crossing one active region ACT, and a source region may be formed outside the two word lines WL, respectively. The source region and the drain region may be formed by the first and second impurity regions 105a and 105b by doping (e.g., performing ion implantation) with substantially the same impurities, and may be varied in concentration depending on circuit configuration of the ultimately formed transistor. In some embodiments, dopant impurities may have a conductivity-type opposite to that of the substrate 101. In some embodiments, the respective depths of the first and second impurity regions 105a and 105b in the source region and the drain region may differ from one another.

The device separation region 110 may be formed (e.g., using a shallow trench isolation (STI) process). The device separation region 110 may substantially surround the active regions ACT and electrically isolate same. The device separation region 110 may include one or more insulating material(s). The device separation region 110 may include a plurality of regions having different depths that vary in accordance with a width of a trench in which the substrate 101. In some embodiments, the device separation region 110 may include a first device separation layer 111 and a second device separation layer 112, wherein the first device separation layer 111 substantially surrounds the second device separation layer 112 between the active regions ACT adjacent in the W direction. In some embodiments, the first device separation layer 111 may include silicon oxide, and the second device separation layer 112 may include silicon nitride.

The word line structures WLS may be disposed in gate trenches 115 extending in the substrate 101. Each of the word line structures WLS may include a gate dielectric layer 120, a word line WL, and a gate capping layer 125. In this regard, the gate 120 WL may be referred to as a structure including the gate dielectric layer 120 and the word line WL, wherein the word line WL may be referred to as a "gate electrode," and the word line structure WLS may be referred to as a "gate structure."

The word line WL may extend in the X direction across the active region ACT. For example, a pair of word lines WL adjacent to each other, may be disposed to cross one active region ACT. The word line WL may constitute a gate of a buried channel array transistor (BCAT), but the scope of the inventive concept is not limited thereto. In some embodiments, the word lines WL may be disposed above the substrate 101. Further, the word line WL may be disposed below the gate trench 115 and have a predetermined thickness. An upper surface of the word line WL may be disposed at a level lower than that of an upper surface of the substrate 101. In this regard, the term "level" (or alternately expressed in some embodiments "height") may be used to denote a relative disposition of one element, material layer, surface or component in relation to another element, material layer, surface or component, or in relation to a designated reference (e.g., an upper surface of the substrate 101). Thus, further in this regard, one element. material layer, surface or component may be said to be disposed at a "higher," "lower," or "same" level as another element, material layer, surface or component.

The word line WL may include one or more conductive material(s), such as for example, polycrystalline silicon (Si), titanium (Ti), titanium nitride (TiN), tantalum (Ta), tantalum nitride (TaN), tungsten (W), tungsten nitride (WN), and aluminum (Al).

In some embodiments, the word line WL may include a lower pattern including a first material and an upper pattern including a second material different from the first material. For example, the lower pattern 121 may include at least on of W, Ti, Ta, tungsten nitride (WN), titanium nitride (TiN), and tantalum nitride (TaN). That is, the lower pattern 121 may include be a metal pattern including at least one metal and/or metal nitride. The upper pattern 122 may include a semiconductor pattern of doped polysilicon. A first thickness of the lower pattern 121 may be greater than a second thickness of the upper pattern 122, wherein each of the lower pattern 121 and the upper pattern 122 extends in the X direction.

The gate dielectric layer 120 may be disposed on a bottom surface and inner side surfaces of the gate trench 115. The gate dielectric layer 120 may conformally cover an inner side wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In some embodiments, the gate dielectric layer 120 may be a layer formed by oxidizing the active region ACT, or a layer formed using a materials deposition process.

The gate capping layer 125 may be disposed above the word line WL to fill the gate trench 115. An upper surface of the gate capping layer 125 may be disposed at substantially the same level as the upper surface of the substrate 101. The gate capping layer 125 may be formed of an insulating material (e.g., silicon nitride). The gate capping layer 125 may be disposed at a level above the word line WL to fill the gate trench 115. An upper surface of the gate capping layer 125 may be disposed at substantially the same level as the upper surface of the substrate 101. The gate capping layer 125 may include at least one insulating material (e.g., silicon nitride).

The pad layers 132 may be electrically connected to the second impurity region 105 among the first and second impurity regions 105a and 105b. The pad layer 132 may be disposed between the second active region 105b and the contact structure 160. The pad layers 132 may be formed of a doped silicon layer (e.g., a polysilicon layer doped with N-type impurities). In some embodiments, the pad layers 132 may be omitted. Hereafter, the pad layer 132 may be referred to as a "conductive pattern."

The insulating barrier layer 134 may penetrate the pad layer 132 to contact the device separation region 110 and the gate capping layer 125. The insulating barrier layer 134 may be formed of one or more insulating materials (e.g., silicon nitride).

The metal-semiconductor compound layer 136 may be, for example, a layer in which a portion of the first conductive pattern 141 is silicided. The metal-semiconductor compound layer 136 may be disposed between the pad layer 132 and the contact structure 160, and substantially surround at least a portion of a lower portion of the contact structure 160. The metal-semiconductor compound layer 136 may include, for example, metal silicide, metal germanide, or metal silicide-germanide.

The buffer insulating layer 137 may include at least one material layer. For example, the buffer insulating layer 137 may include a first buffer insulating layer 137a and a second buffer insulating layer 137b on the first buffer insulating layer 137a. The first buffer insulating layer 137a and the second buffer insulating layer 137b may be formed of different insulating materials. For example, the first buffer insulating layer 137a may be formed of silicon oxide, and the second buffer insulating layer 137b may be formed of silicon nitride. The number and/or type of layers constituting the buffer insulating layer 137 may vary be design and application according to embodiments of the inventive concept.

The bitline structure BLS may extend in a direction (e.g., the Y direction) substantially perpendicular to the word line WL. The bitline structure BLS may include a bitline BL and a bitline capping pattern BC on the bitline BC. The bitline structure BLS may be disposed on a cell array region CAR. The bitlines BL, adjacent to each other, may have facing side surfaces.

The bitline BL may include a first conductive pattern 141, a second conductive pattern 142, and a third conductive pattern 143 that are sequentially stacked. The bitline capping pattern BC may be disposed on the third conductive pattern 143. A buffer insulating layer 137 may be disposed between the first conductive pattern 141 and the substrate 101, and a portion of the first conductive pattern 141 (hereinafter, a bitline contact pattern DC) may contact a first impurity region 105a of the active region ACT. The bitline BL may be electrically connected to the first impurity region 105a through the bitline contact pattern DC. A lower surface of the bitline contact pattern DC may be disposed on a level lower than the upper surface of the substrate 101, and may be disposed at a level higher than the upper surface of the word line WL. The bitline contact pattern DC may be formed in the substrate 101 to be locally disposed in a bitline contact hole 135 exposing the first impurity region 105a.

The first conductive pattern 141 may include a semiconductor material such as polycrystalline silicon. The first conductive pattern 141 may directly contact the first impurity region 105a. The second conductive pattern 142 may include a metal-semiconductor compound. Here, the metal-semiconductor compound may include, for example, a layer in which a portion of the first conductive pattern 141 is silicided. In this regard, the metal-semiconductor compound may include at least one of cobalt silicide (CoSi), titanium silicide (TiSi), nickel silicide (NiSi), tungsten silicide (WSi), or some other metal silicide. The third conductive pattern 143 may include a metal, such as for example, Ti, Ta, W, or Al. The number of conductive patterns included in the bitline BL, the type of material(s), and/or the stacking order of same will vary by design in accordance with various embodiments of the inventive concept.

The bitline capping pattern BC may be disposed on the third conductive pattern 143. The bitline capping pattern BC may include one or more insulating material(s) (e.g., a silicon nitride film). The bitline capping pattern BC may include a plurality of layers including the same or different material(s).

The spacer structures SS may be disposed on both side surfaces of each of the bitline structures BLS, to extend in one direction (e.g., the Y direction). The spacer structures SS may be disposed between the bitline structure BLS and the contact structure 160. The spacer structures SS may be disposed to extend along side surfaces of the bitline BL and side surfaces of the bitline capping pattern BC. A pair of spacer structures SS disposed on both sides of one bitline structure BLS may have an asymmetric shape with respect to the bitline structure BLS. Each of the spacer structures SS may include a plurality of spacers 154 and 155. The plurality of spacers 154 and 155 may include a first spacer 154 and a second spacer 155, sequentially disposed from a side surface of the bitline structure BLS. However, the number and/or arrangement of the plurality of spacers included in the spacer structure SS may vary by design in accordance with various embodiments of the inventive concept.

The spacer structures SS may further include a bitline contact spacer DCS. The bitline contact spacer DCS may fill a remainder of the bitline contact hole 135 in which the bitline contact pattern DC is formed. The bitline contact spacer DCS may include a plurality of spacer layers 151, 152, and 153. The first spacer layer 151 may extend along a side surface of the bitline contact hole 135, the second spacer layer 152 may cover the first spacer layer 151, and substantially surround the bitline contact pattern DC, and the third spacer layer 153 may be disposed to fill an inner space of the first spacer layer 151. However, the structure of the bitline contact spacer DCS may vary by design in accordance with various embodiments of the inventive concept.

Each of the layers constituting the spacer structure SS may include an insulating material, such as for example, silicon oxide, silicon nitride, silicon oxynitride, and/or silicon oxycarbide.

The insulating fence 158 may be disposed in a spaced apart manner and extend the Y direction between the bitline structures BLS. The insulating fence 158 may vertically overlap the word line structures WLS. The insulating fence 158 may be disposed between the bitline structures BLS in the X direction and between the contact structures 160 in the Y direction. The contact structure 160 may be disposed on a first region of a side surface of the spacer structure SS, the insulating fence 158 may be disposed on a second region of the side surface of the spacer structure SS, and the insulating fence 158 may have a side surface facing a side surface of the conductive contact layer 162.

The contact structure 160 may be electrically connected to one region of the active region ACT (e.g., the second impurity region 105*b*). The contact structure 160 may be electrically connected to the second impurity region 105*b* through the metal-semiconductor compound layer 136 and the pad layer 132 disposed thereunder. The contact structure 160 may be disposed between the adjacent bitline structures BLS, and may be disposed on a side surface of the spacer structure SS. The contact structure 160 may be disposed, for example, between adjacent spacer structures SS. A lower surface of the contact structure 160 may be located on a level lower than an upper surface of the substrate 101, and may be located on a level higher than a lower surface of the bitline contact pattern DC. The contact structure 160 may be insulated from the bitline contact pattern DC by the spacer structure SS.

The contact structure 160 may include a barrier layer 161, a conductive contact layer 162, and an airgap AG1. The conductive contact layer 162 may include a first portion 162A and a second portion 162B on the first portion 162A, and the barrier layer 161 may substantially surround the first portion 162A of the conductive contact layer 162, and the airgap AG1 may substantially surround the second portion 162B of the conductive contact layer 162.

The barrier layer 161 may substantially surround a lower region LS of a lower surface and side surfaces of the conductive contact layer 162. The barrier layer 161 may have an upper surface 161US recessed to a level lower than an upper surface of the conductive contact layer 162. The recessed upper surface 161US of the barrier layer 161 may be disposed on a level lower than a lower end of the separation insulating pattern 175, and may be disposed on a level lower than an upper surface of the bitline BL. The recessed upper surface 161US of the barrier layer 161 may be disposed on a level higher than an upper end of the metal-semiconductor compound layer 136. The barrier layer 161 may include, for example, a conductive metal nitride such as TiN, TaN, or WN.

The conductive contact layer 162 may be electrically connected to the second impurity region 105*b* of the active region ACT on a first portion of a side surface of the spacer structure SS. The conductive contact layer 162 may include at least one conductive material, such as for example, a doped semiconductor material and/or a metal material. Here, the doped semiconductor material may include doped silicon or doped germanium, and the metal material may include at least one of, for example, Ti, Ta, W, Al, cobalt (Co), and/or ruthenium (Ru).

The air gap AG1 may substantially surround upper regions US of side surfaces of the conductive contact layer 162. The air gap AG1 may be disposed between a second portion 162B of the conductive contact layer 162 and the spacer structure SS and between the second portion 162B of the conductive contact layer 162 and the insulating fence 158. An upper portion of the air gap AG1 may be capped by the protruding portions P1 and P2 of the upper conductive pattern 170 and a separation insulating pattern 175.

In some embodiments, since the semiconductor device 100 includes the airgap AG1, mutual interference and parasitic capacitance between the bitline BL and the contact structure 160 is reduced, and leakage current is inhibited. Accordingly, electrical characteristics of the semiconductor device may be improved. In addition, even if some misalignment occurs during an etching process used to form the separation insulating patterns 175, resulting defects caused by conductive metal nitride forming a barrier layer 161 between the upper conductive patterns 170 forming a bridge may be minimized. Accordingly, reliability of the semiconductor device is improved.

The upper conductive pattern 170 may be disposed on the bitline structure BLS and the contact structure 160. The upper conductive pattern 170 may contact an upper surface of the conductive contact layer 162. The upper conductive pattern 170 may include a first protruding portion P1 and a second protruding portion P2 protruding from a portion, in contact with an upper surface of the conductive contact layer 162, toward the airgap AG1. The first protruding portion P1 may extend between the spacer structure SS and a second portion 162B of the conductive contact layer 162 to contact an upper region of a first side surface of the second portion 162B of the conductive contact layer 162. The first side surface of the second portion 162B of the conductive contact layer 162 may face the spacer structure SS. The second protruding portion P2 may extend between the insulating fence 158 and a second portion 162B of the conductive contact layer 162 to contact an upper region of a second side surface of the second portion 162B of the conductive contact layer 162. The second side surface of the second portion 162B of the conductive contact layer 162 may face the insulating fence 158. The upper conductive pattern 170 may include at least one metal material, such as for example, Ti, Ta, W, Al, Co, and Ru.

The separation insulating pattern 175 may penetrate through the upper conductive pattern 170, to contact the conductive contact layer 152, the insulating fence 158, and the spacer structure SS. The separation insulating pattern 175 may include an insulating material, for example, silicon nitride or silicon oxynitride. The separation insulating pattern 175 may cap the air gap AG1 on a level lower than the protruding portions P1 and P2 of the upper conductive pattern 170. The separation insulating pattern 175 may have a width in a horizontal direction that becomes narrower as it extends towards the substrate 101, and may therefore have a side surface inclined with respect to the upper surface of the substrate 101. In other embodiments, a portion of the separation insulating pattern 175 may be disposed to fill a portion of a space in which the air gap AG1 is formed.

The data storage structure CAP may be disposed on the upper conductive pattern 170. The data storage structure CAP may be electrically connected to the contact structure 160 through the upper conductive pattern 170. The data storage structure CAP may include a first electrode 181, a second electrode 182, and an information storage dielectric 185 between the first and second electrodes 181 and 182. The first electrode 181 may have a pillar shape, but may alternately have a cylinder shape or some other shape. Here, however, the structure of the data storage structure CAP is not limited to only the illustrated examples.

Each of the first electrode 181 and the second electrode 182 may include at least one of, for example, a doped semiconductor material, a conductive metal nitride, metal, and/or a metal-semiconductor compound. The information storage dielectric 185 may conformally cover the first electrode 181. The information storage dielectric 185 may include, for example, at least one of a high-K material such as zirconium oxide ($ZrO_2$), aluminum oxide ($Al_2O_3$), and hafnium oxide ($Hf_2O_3$). Here, the term "high-K material" denotes a dielectric material having a dielectric constant higher than that of silicon oxide.

In the peripheral region PCR, a peripheral gate structure GS may be disposed on a peripheral active region ACT_P. Source/drain regions 30 may be disposed on the peripheral active region ACT_P on opposing sides of the peripheral gate structure GS. The peripheral gate structure GS may include a peripheral gate dielectric layer 40, peripheral gate electrodes 41, 42, and 43, and a peripheral gate capping layer 46, which are sequentially stacked on the substrate 101. The peripheral gate spacers 51 and 52 may cover side surfaces of the peripheral gate electrodes 41, 42, and 43, and an insulating liner 53 may cover the peripheral gate structure GS and peripheral gate spacers 51 and 52.

The peripheral active region ACT_P may be understood as including the peripheral device separation region 10, and the peripheral device separation region 10 may be understood as including a first device separation layer 11 and a second device separation layer 12. The peripheral gate dielectric layer 40 may include silicon oxide, silicon nitride, or a high-K material.

In some embodiments, the peripheral gate electrodes 41, 42, and 43 may have a structure and includes material(s) substantially similar to that of the bitline BL. However, the peripheral gate electrodes 41, 42, and 43 may have a wide greater than that of the bitline BL.

A first interlayer insulating layer 66 including silicon oxide and a second interlayer insulating layer including silicon nitride may be disposed on the insulating liner 53. A peripheral upper conductive pattern 70 may be disposed on the second interlayer insulating layer 68, and to peripheral separation insulating pattern 75 may penetrate through the peripheral upper conductive pattern 70.

A peripheral contact structure 60 connected to the source/drain regions 30 may be disposed on a side surface of the peripheral gate structure GS. The peripheral contact structure 60 may penetrate the interlayer insulating layers 51 and 52 and the insulating liner 53 and may recess a portion of the substrate 101. The peripheral contact structure 60 may include a peripheral barrier layer 61, a peripheral conductive contact layer 62, and a second airgap AG2. The second airgap AG2 may substantially surround a first portion 62A of the peripheral conductive contact layer 62 of the peripheral barrier layer 61, and the second airgap AG2 may substantially surround a second portion 62B on the first portion 62A of the peripheral conductive contact layer 62. A peripheral metal-semiconductor compound layer 36 may be disposed between the peripheral contact structure 60 and the peripheral active region ACT_P. The peripheral contact structure 60 may be connected to an upper contact structure 90 penetrating through the upper insulating layer 80. The upper contact structure 90 may include a barrier layer 91 and a conductive contact layer 92.

Figure 3:
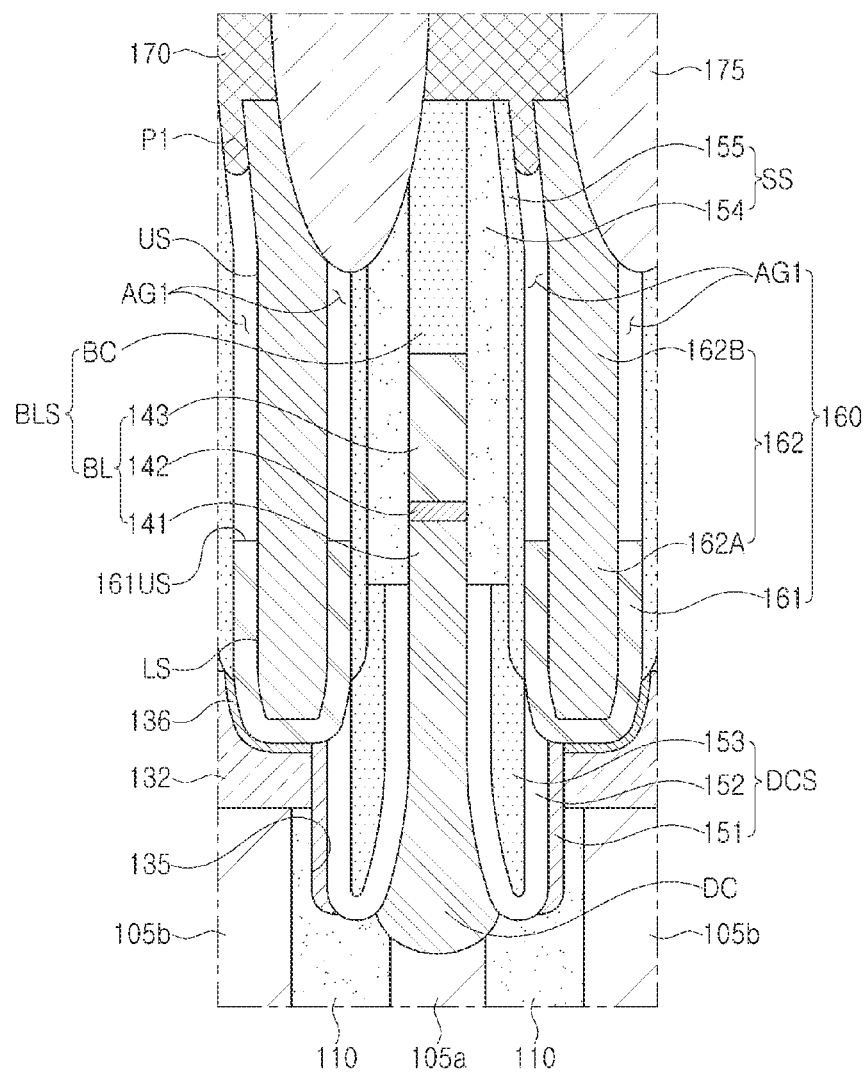
FIGS. 3, 4, 5, 6, 7, 8, 9 and 10 (hereafter collectively, "FIGS. 3 to 10") are respective partially enlarged cross-sectional views of the region 'A' indicated in FIG. 2A according to various embodiments of the inventive concept.

FIGS. 4, 5, 6, 7, 8, 9 and 10 are each a partially enlarged cross-sectional view of region 'A' indicated in FIG. 2A and may be understood as being respectively the same, except for specifically noted variations, as the semiconductor device 100 of FIG. 3.

Figure 4:
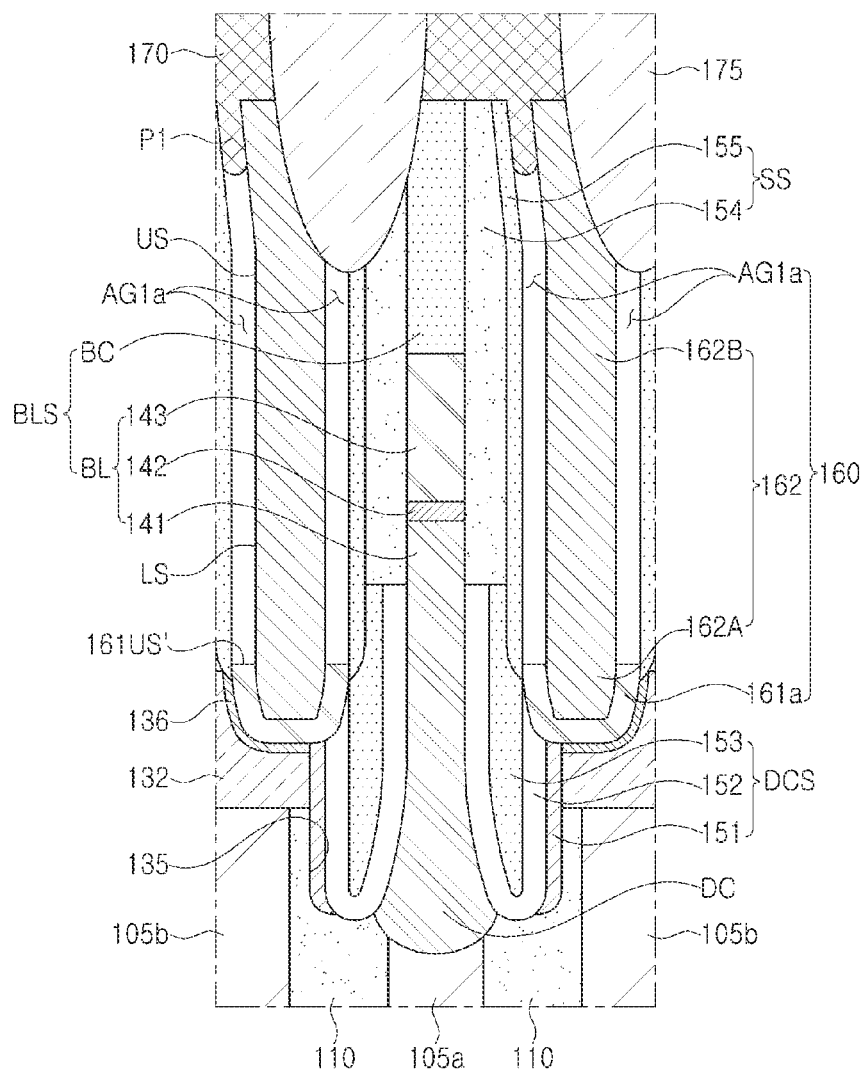

Referring to FIG. 4, a height of a recessed upper surface 161us of the barrier layer 161a in a semiconductor device 100A may be lower than that of the semiconductor device 100. For example, the recessed upper surface 161us' may be disposed at a level lower than an upper surface of the first conductive pattern 141. Accordingly, a vertical length of an air gap AG1a substantially surrounding the second portion 162B of the conductive contact layer 162 may be increased.

Figure 5:
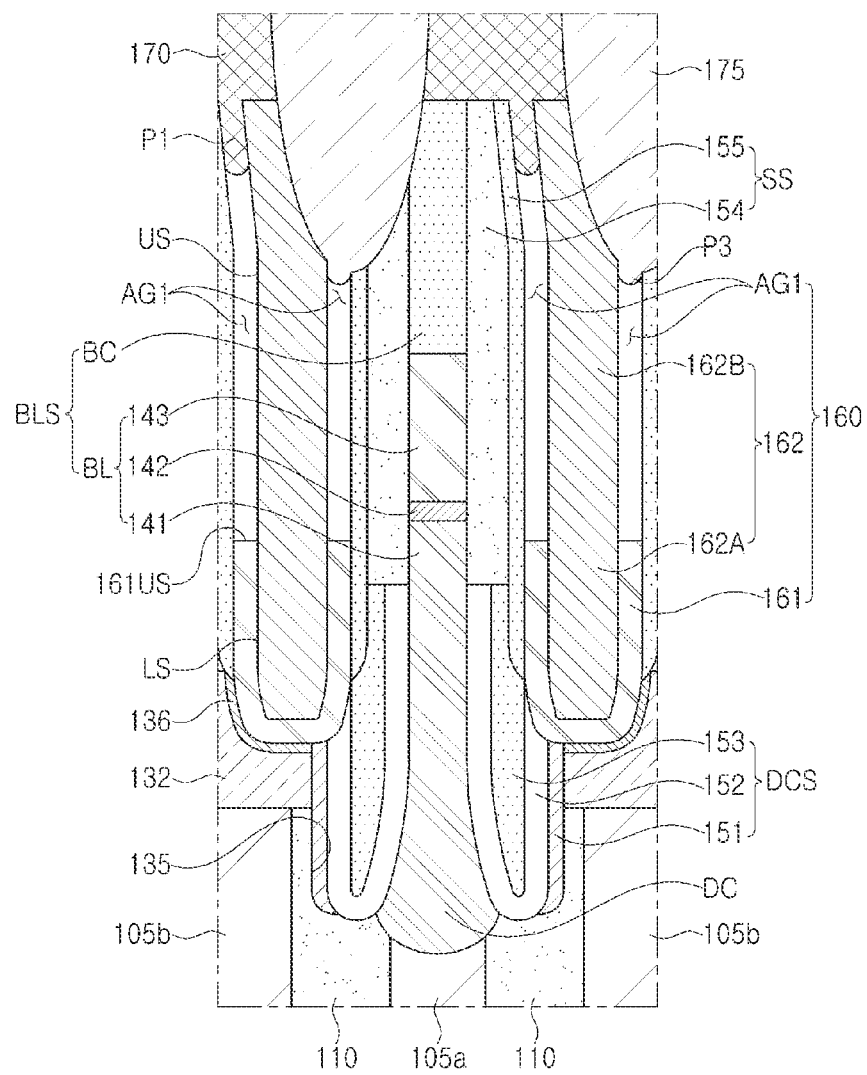

Referring to FIG. 5, in a semiconductor device 100B, a separation insulating pattern 175 may include a protruding portion P3 facing the air gap AG1. Here, the protruding portion P3 of the separation insulating pattern 175 may extend between a second portion 162B of the conductive contact layer 162 and the spacer structure SS to contact an upper region of a side surface of the second portion 162B of the conductive contact layer 162. A lower end of the protruding portion P3 of the separation insulating pattern 175 may be disposed at a level lower than that of a lower end of the protruding portion P1 of the upper conductive pattern 170.

Figure 6:
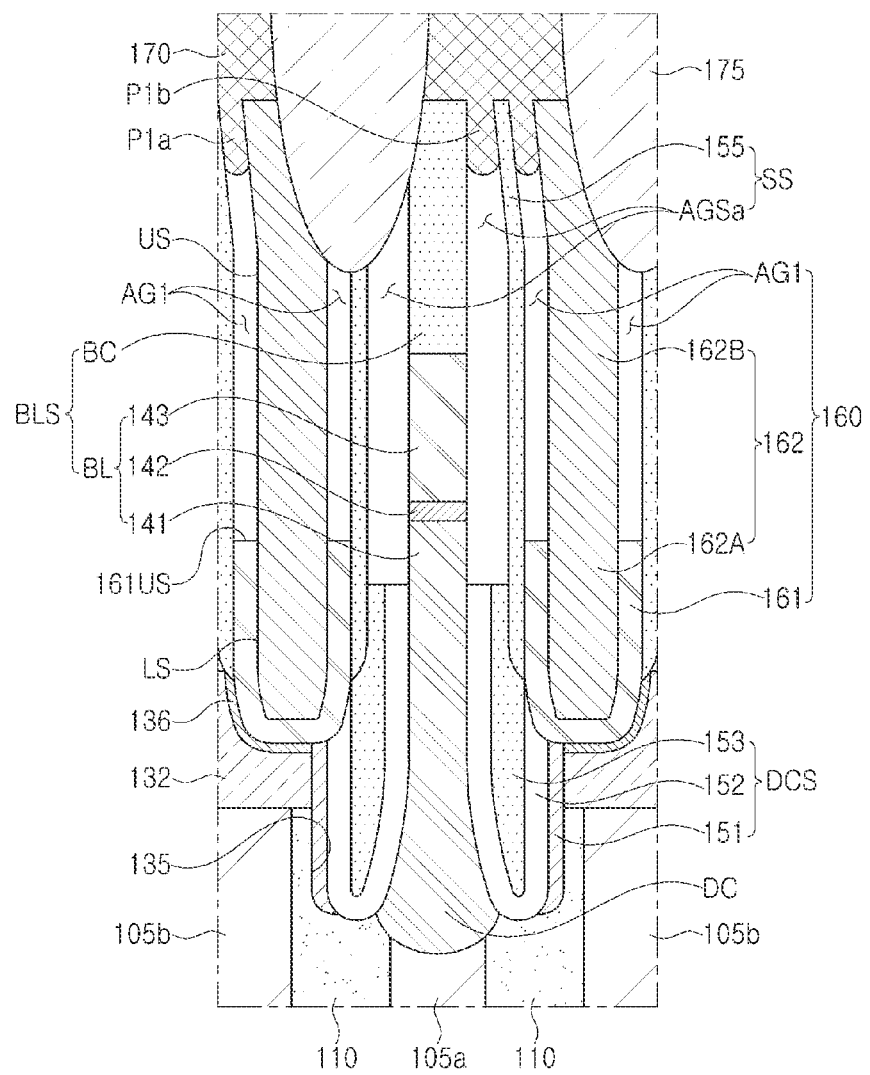

Referring to FIG. 6, in a semiconductor device 100C, the spacer structure SS may include an air gap spacer AGSa formed at a location from which the first spacer 154 has been removed. Thus, the second spacer 155 may be disposed between the air gap spacer AGSa and the air gap AG1 of the contact structure 160. The semiconductor device 100C may include the air gap spacer AGSa and the air gap AG1, so that mutual interference and parasitic capacitance between the bitline BL and the contact structure 160 may be further reduced, and leakage current may be further inhibited.

Figure 7:
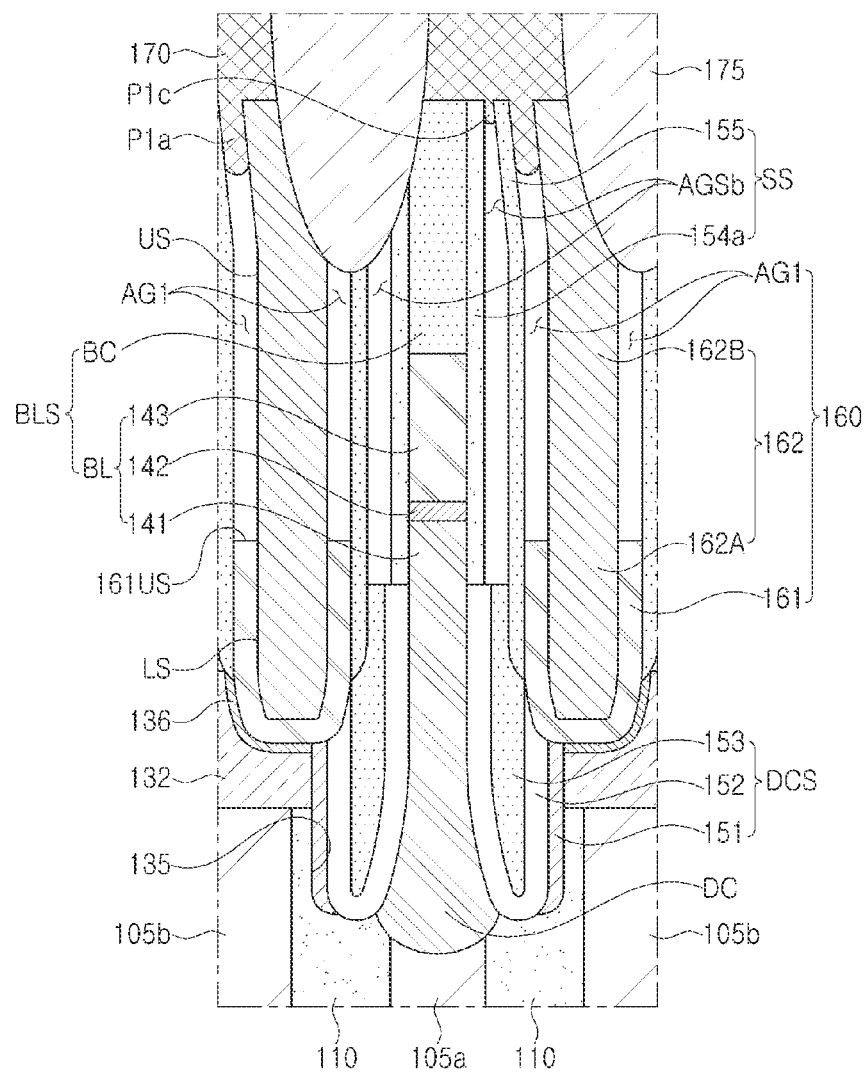

Referring to FIG. 7, in a semiconductor device 100D, the spacer structure SS may include an air gap spacer AGSb, a first spacer 154a between the air gap spacer AGSb and the bitline structure BL, and a second spacer 155 between the air gap spacer AGSb and the air gap AG1. The semiconductor device 100D may include the air gap spacer AGSb and the air gap AG1, so that mutual interference and parasitic capacitance between the bitline BL and the contact structure 160 may be further reduced, and leakage current may be further inhibited.

Figure 8:
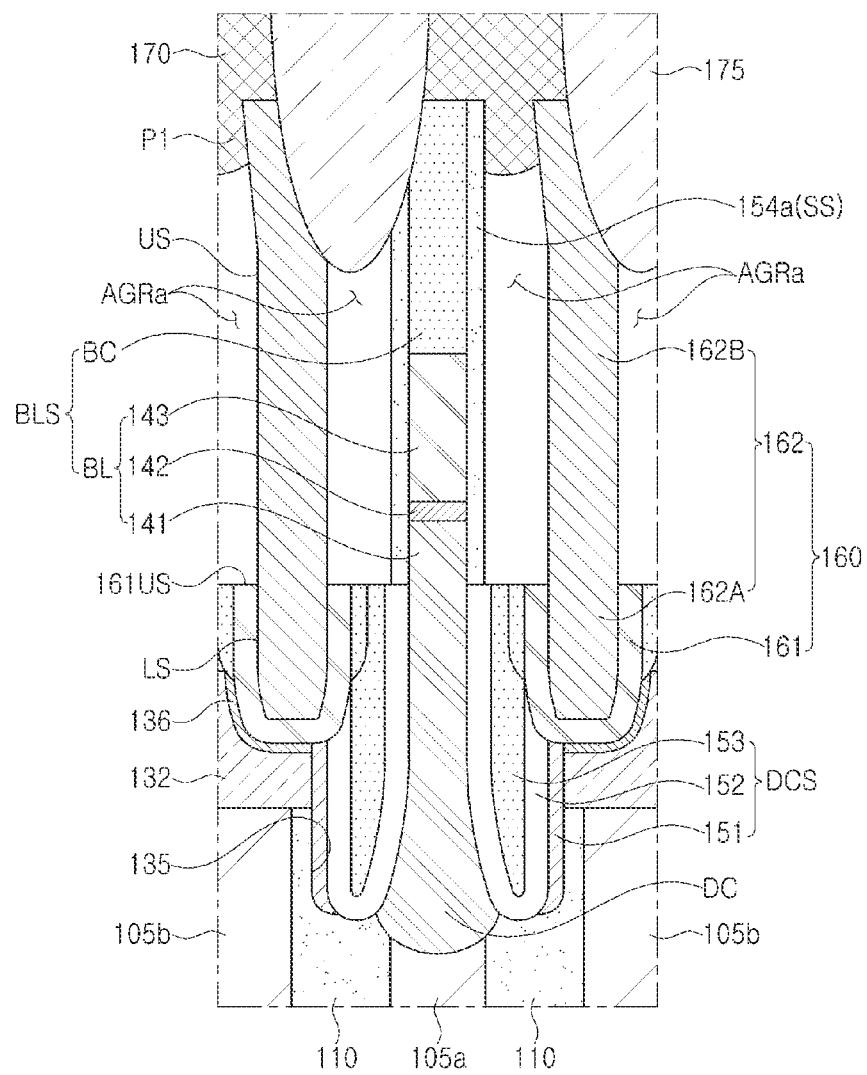

Referring to FIG. 8, a semiconductor device 100E may include an air gap region AGRa between the second portion 162B of the conductive contact layer 162 and the first spacer 154a. The air gap region AGRa may include an air gap (see, e.g., AG1 of FIG. 7) and a first air gap spacer (see, e.g., AGSb of FIG. 7)) formed by removing the barrier layer 161, and a second air gap spacer formed by removing the second spacer layer 155 of FIG. 7. The air gap region AGRa may be defined by an empty space between an outer side surface of the first spacer 154a covering the bitline structure BLS and a side surface of the conductive contact layer 162. The semiconductor device 100E may include air gap spacer AGRa, so that mutual interference and parasitic capacitance between the bitline BL and the contact structure 160 may be further reduced, and leakage current may be further inhibited. Alternately, the separation insulating patterns 175 may fill (or intrude into) at least a portion of the air gap regions AGRa.

Figure 9:
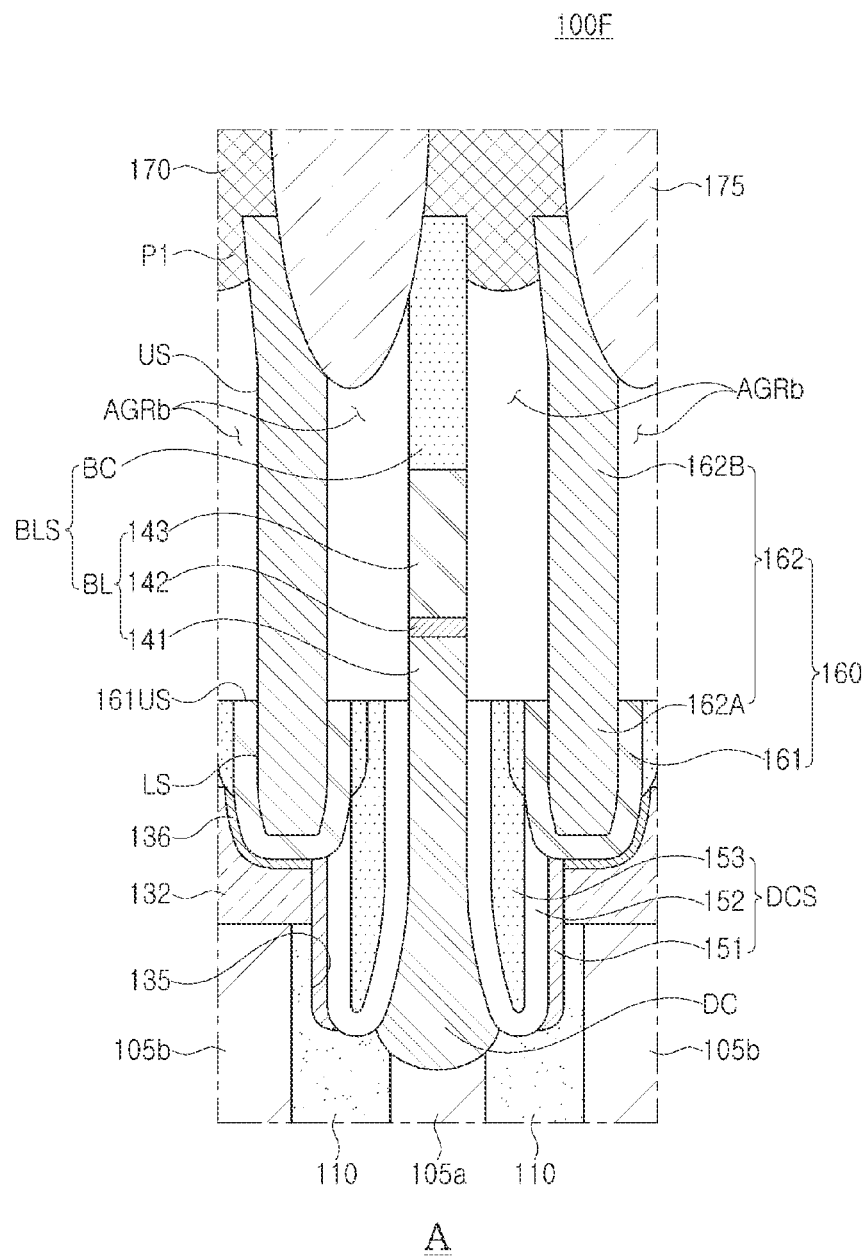

Referring to FIG. 9, a semiconductor device 100F may include an air gap region AGRb between the second portion 162B of the conductive contact layer 162 and the bitline structure BLS. The air gap region AGRb may include an air gap (see, e.g., AG1 of FIG. 7) formed by removing the barrier layer 161 and a first air gap spacer (see, e.g., AGSb of FIG. 7), and second and third air gap spacers formed by the first and second spacers 154a and 155 in FIG. 7. The air gap region AGRb may be defined by an empty space between a side surface of the bitline structure BLS and a side surface of the conductive contact layer 162. The semiconductor device 100F may include air gap regions AGRb, so that mutual interference and parasitic capacitance between the bitline BL and the contact structure 160 may be further reduced, and leakage current may be further inhibited. Alternately, the separation insulating patterns 175 may fill (or intrude into) at least a portion of the air gap regions AGRb.

Figure 10:
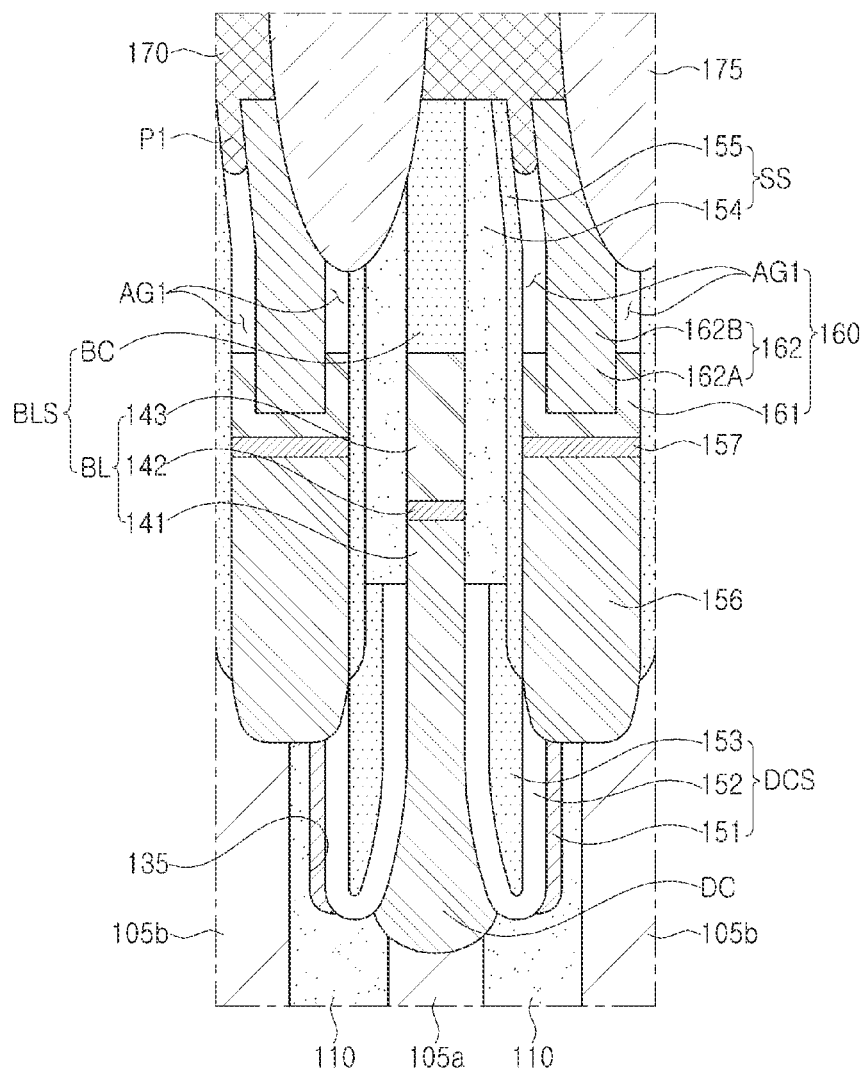

Referring to FIG. 10, a semiconductor device 100G may omit pad layers 132 and insulating barrier layers 134, and further include a lower conductive pattern 156 on the active region ACT and a metal-semiconductor compound layer 157 on the lower conductive pattern 156. The lower conductive pattern 156 may be connected to one region of the active region ACT, for example, the second impurity region 105. A lower surface of the lower conductive pattern 156 may be located on a level lower than the upper surface of the substrate 101, and may be located on a level higher than a lower surface of the bitline contact pattern DC. The lower conductive pattern 156 may be formed of a conductive material including for example at least one of polycrystalline silicon (Si), Ti, TiN, Ta, TaN, W, WN, and Al. The metal-semiconductor compound layer 157 may be disposed between the lower conductive pattern 156 and the contact structure 160. The metal-semiconductor compound layer 157 may include, for example, metal silicide, metal germanide, or metal silicide-germanide.

FIGS. 11 to 15 are respective cross-sectional views illustrating methods of manufacture for various semiconductor devices according to embodiments of the inventive concept.

Figure 11:
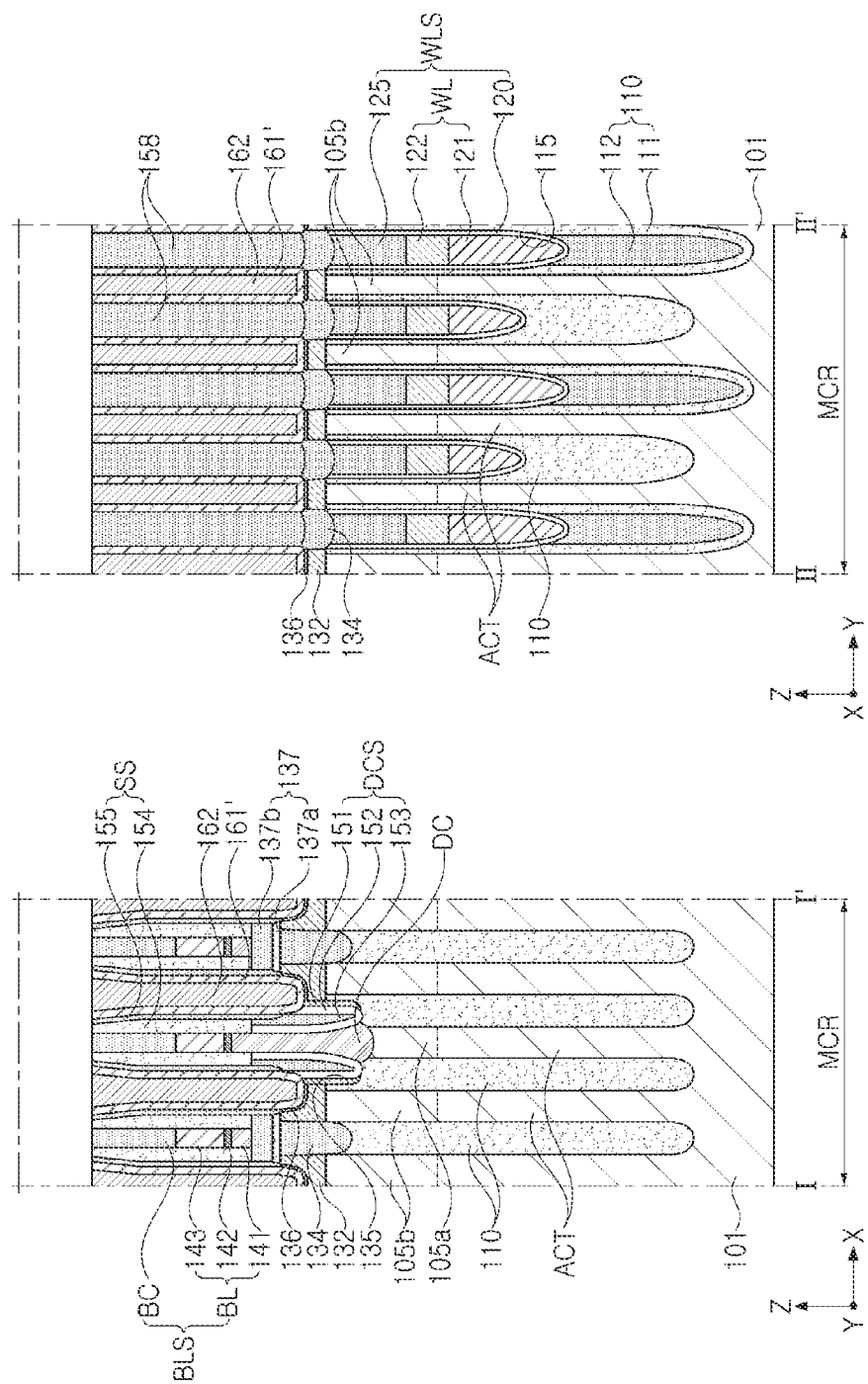
FIGS. 11, 12, 13, 14 and 15 (hereafter collectively, "FIGS. 11 to 15") are respective cross-sectional views illustrating methods of manufacture for various semiconductor devices according to embodiments of the inventive concept.

Referring to FIG. 11, a device separation region 110 may be formed on the substrate 101 to define an active region ACT in a memory cell array region MCR. The device separation region 11 may also be formed in a peripheral region PCR to define a peripheral active region ACT_P. (See, e.g., FIG. 2B). Impurity regions may be formed above the active region ACT by performing an ion implantation process using the device separation region 110 as an ion implantation mask.

The active region ACT and the device separation region 110 may be patterned to form a gate trench 115, and a gate dielectric layer 120, a word line WL, and a gate capping layer 125 may be formed in the gate trench 115. Accordingly, a word line structure WLS may be formed. The word line structure WLS may be separated into the impurity regions by the gate trench 115 to form a first impurity region 105a and a second impurity region 105b.

Pad layers 132 and insulating barrier layers 134 penetrating the pad layers 132 may be formed on the substrate 101, and a buffer insulating layer 137 may be formed on the substrate 101.

A bitline contact hole 135 may be formed, a bitline contact spacer DCP and a bitline contact pattern DC in the bitline contact hole 135 may be formed, and a bitline BL and a bitline capping pattern BC may be formed. Accordingly, a bitline structure BLS may be formed.

Insulating spacer layers may be formed on a side surface of the bitline structure BLS, a portion of the insulating spacer layers may be etched to form a spacer structure SS, and contact holes partially exposing the pad layers 132 may be formed. Before forming the contact holes, sacrificial patterns may be formed between the bitline structures BLS, a portion of the sacrificial patterns may be etched at a position vertically overlapping with the word line structure WLS, and then a material other than the sacrificial patterns may be filled, to form insulating fences 158.

By filling the contact holes with a conductive material, and performing a planarization process, preliminary contact structures 161' and 162 may be formed. The preliminary contact structures 161' and 162 may include a barrier layer 161' and a conductive contact layer 162, and an upper end of the barrier layer 161' may be disposed on substantially the same level as an upper end of the conductive contact layer 162.

Figure 12:
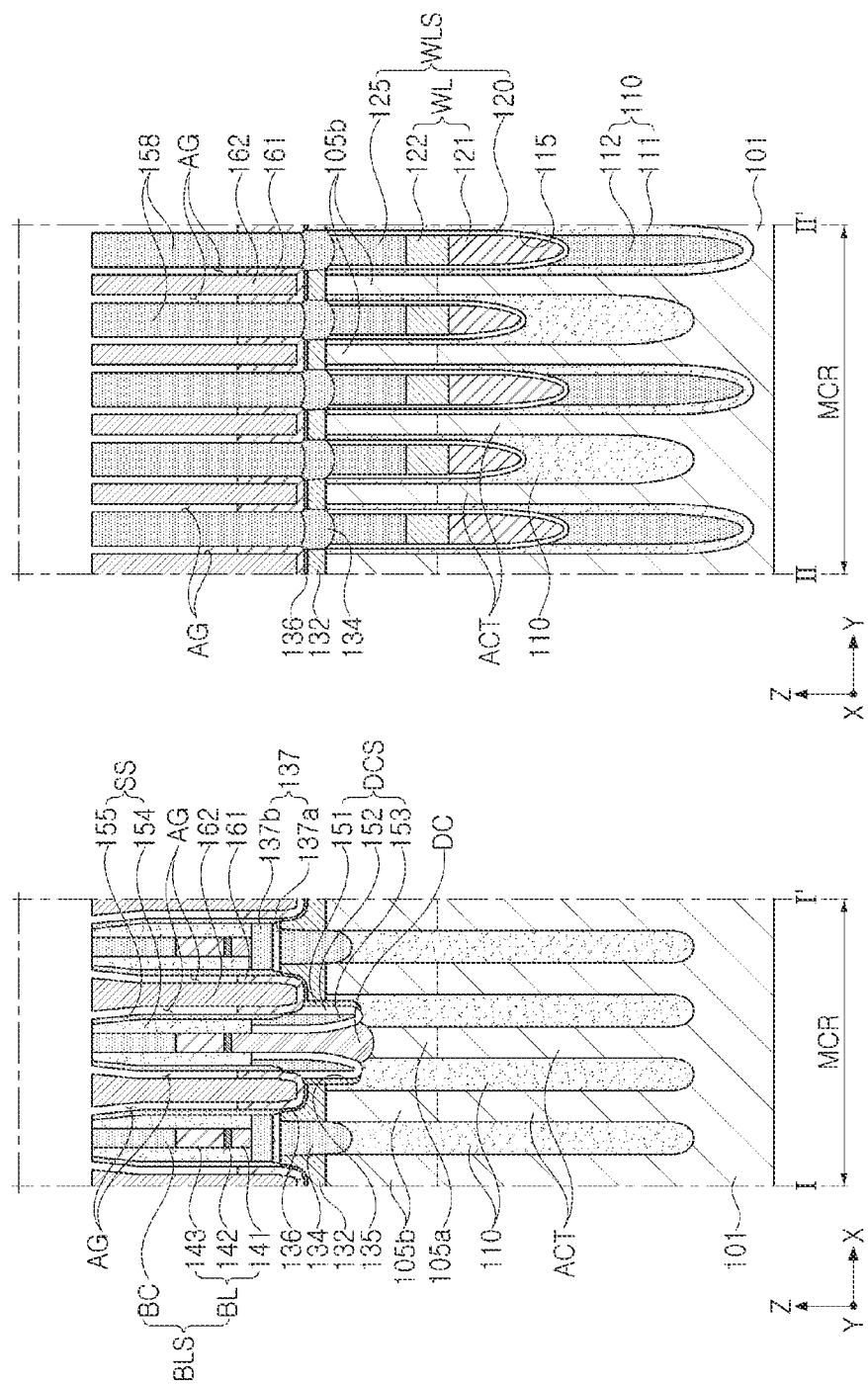

Referring to FIG. 12 in relation to the foregoing, a portion of the barrier layers 161' may be selectively removed with respect to the conductive contact layers 162. Each of the barrier layers 161' may be recessed from the upper end thereof so that an upper surface thereof 161US may be located on a level lower than upper surfaces of the conductive contact layers 162. Gap regions AG may be formed in a region from which the barrier layers 161' are partially removed.

At about this point in the method of manufacture, even in the peripheral region PCR, a barrier layer 61 may be recessed from the upper end, so that an upper surface thereof may be located on a level lower than an upper surface of the peripheral conductive contact layer 62. Alternately, a process of etching the barrier layer may be performed only on the memory cell array region MCR.

Figure 13:
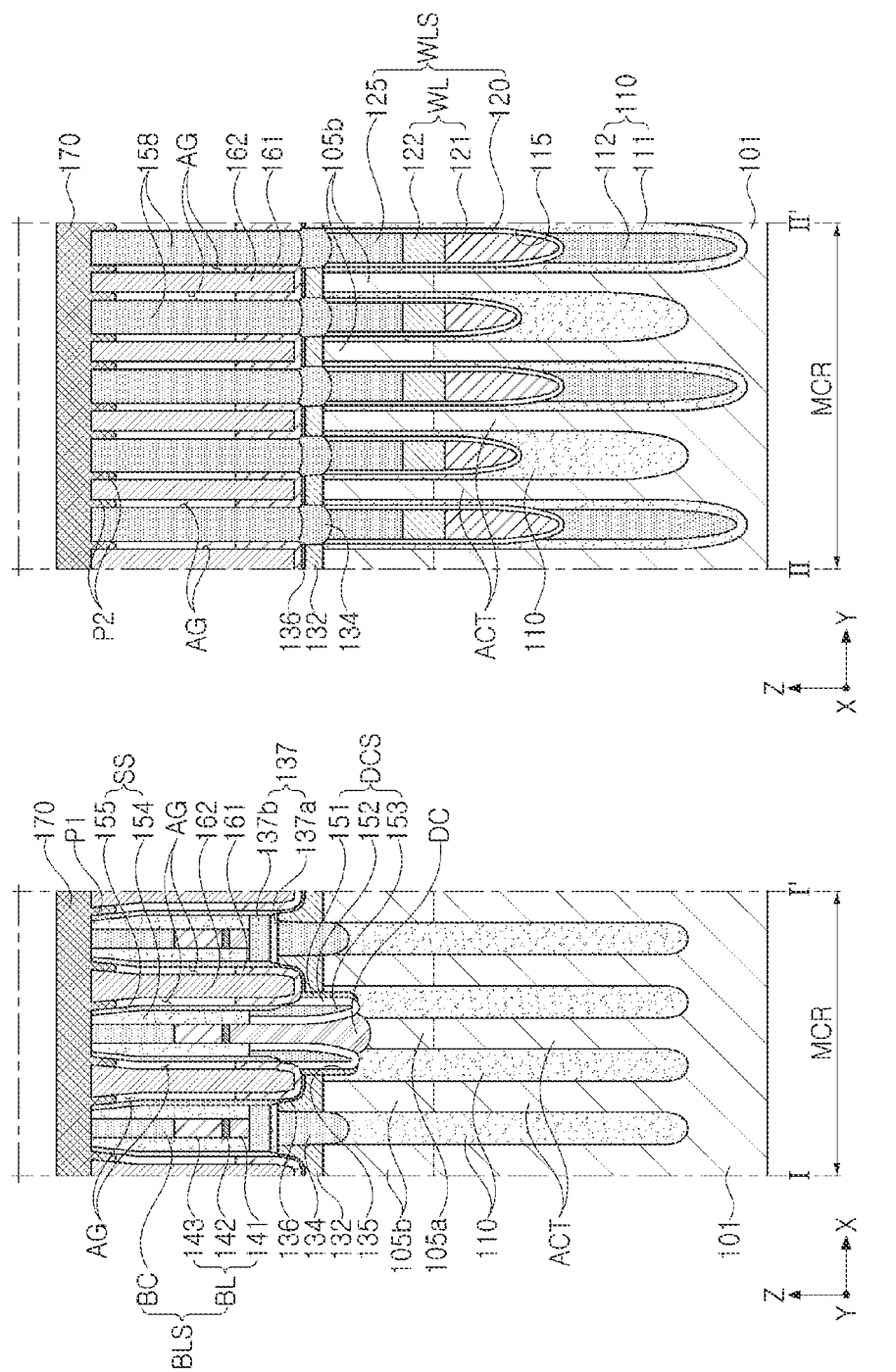

Referring to FIG. 13 in relation to the foregoing, an upper conductive pattern 170 may be formed. The upper conductive pattern 170 may be formed on a bitline structure BLS, a spacer structure SS, and an insulating fence 158, and may be in direct contact with an upper surface of the conductive contact layer 162. The upper conductive pattern 170 may be formed to have protruding portions P1 and P2 partially filling a region in which a portion of the barrier layer 161 is removed. Gap regions AG may be capped in a space between the protruding portions P1 and P2 and the barrier layer 161 having the recessed upper surface 161US.

At about this point in the method of manufacture, even in the peripheral region PCR, a peripheral upper conductive pattern 70 capping upper a portion of gap regions formed by recessing the peripheral barrier layer 61 may be formed. Accordingly, a peripheral contact structure 60 including a peripheral barrier layer 61, a peripheral conductive contact layer 62, and a second air gap AG2 may be formed.

Figure 14:
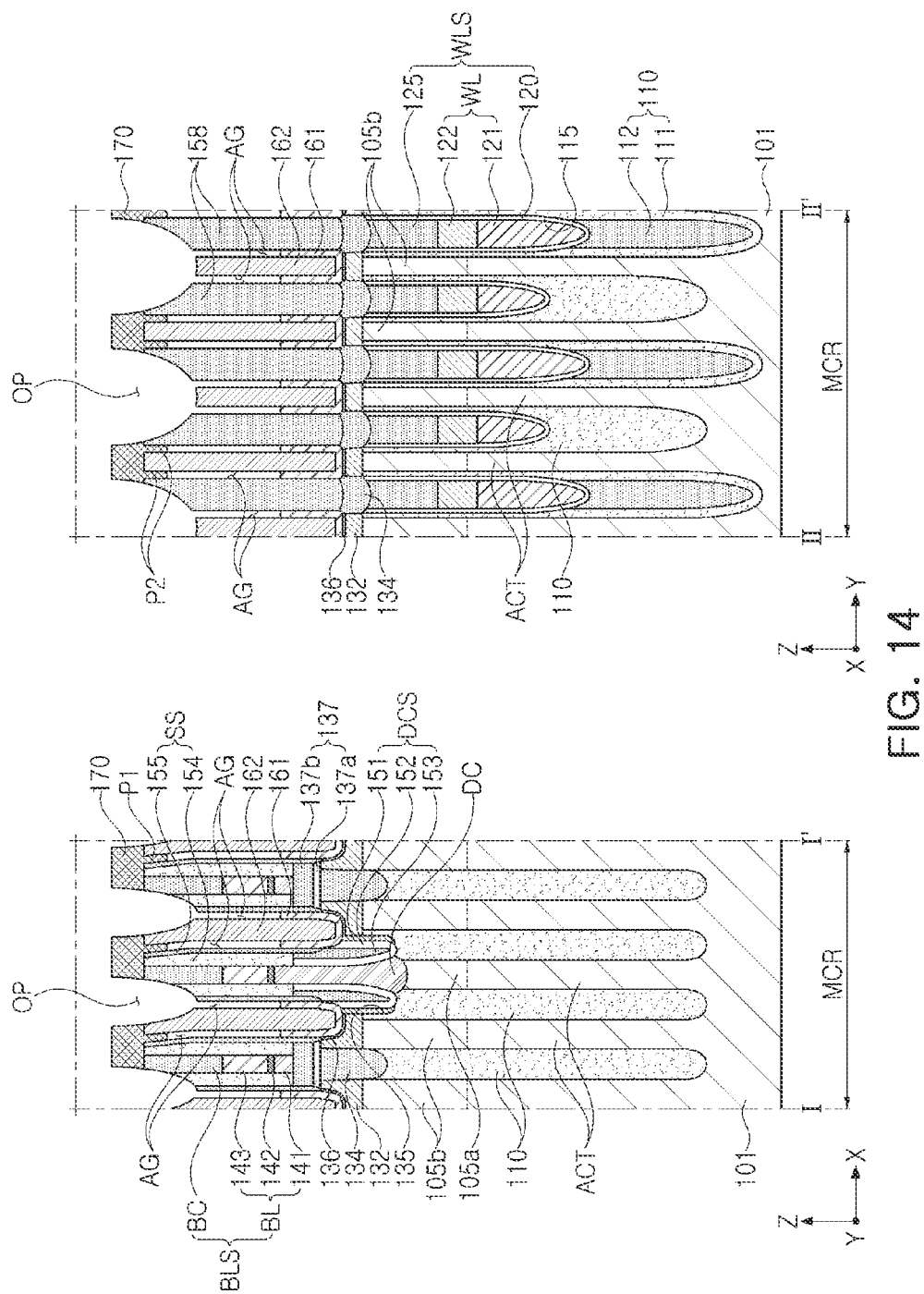

Referring to FIG. 14 in relation to the foregoing, separation openings OP penetrating through the upper conductive pattern 170 may be formed. The separation openings OP may expose a portion of each of the conductive contact layer 162, the spacer structure SS, and the insulating fence 158. The separation openings OP may expose a portion of the air gap regions AG. At about this point in the method of manufacture, at least one spacer constituting the spacer structure SS may be removed through the separation openings OP.

Figure 15:
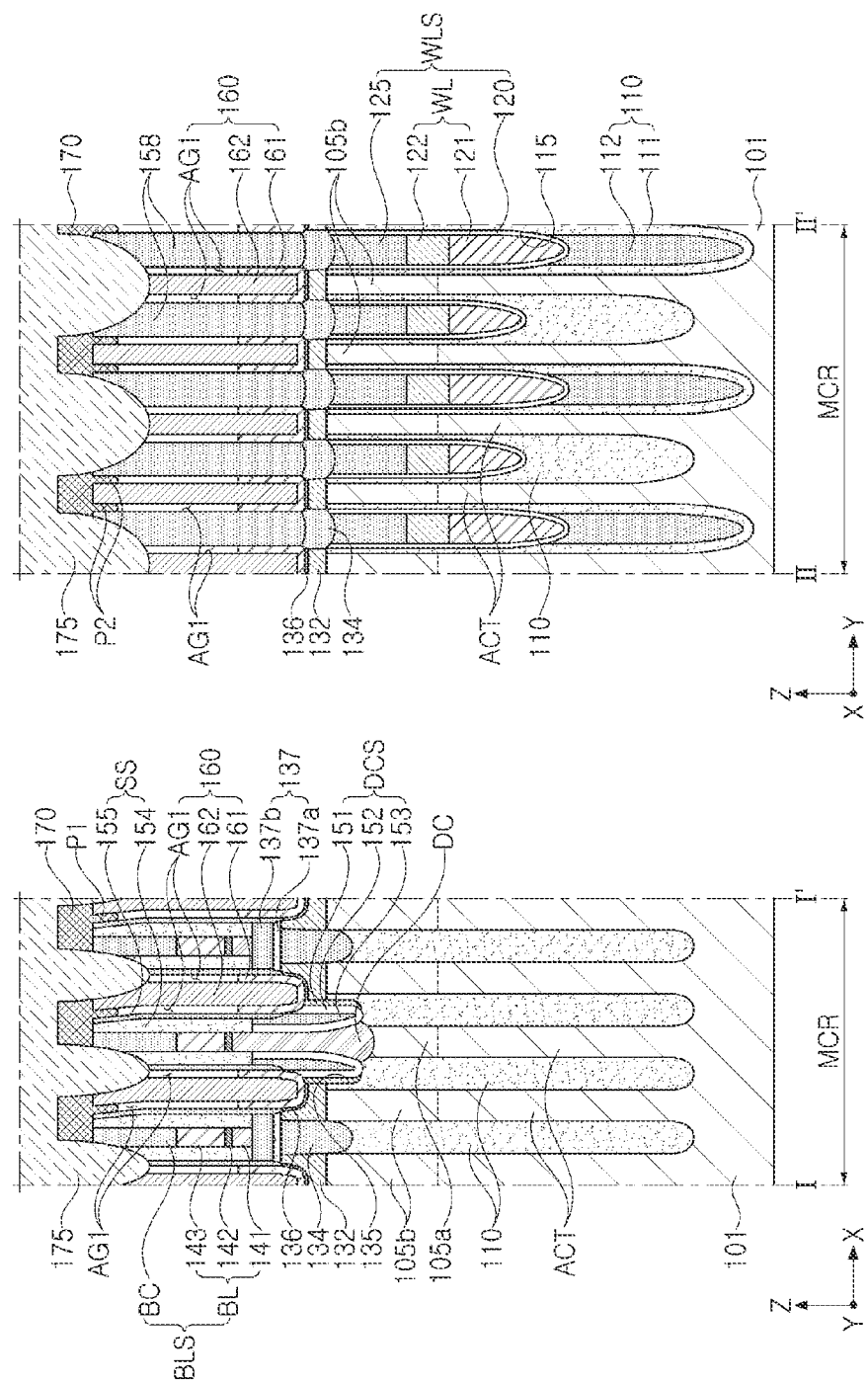

Referring to FIG. 15 in relation to the foregoing, separation insulating patterns 175 filling the separation openings OP may be formed. The separation insulating patterns 175 may be also partially formed on the upper conductive patterns 170 while filling the separation openings OP. The gap regions AG may be finally sealed or capped by the upper conductive patterns 170 and the separation insulating patterns 175 to form the air gaps AG1. Accordingly, the contact structure 160 may be formed. Thereafter, a planarization process may be performed to remove a portion of the separation insulating patterns 175 on the upper conductive patterns 170.

Thereafter, as illustrated in FIG. 2A, a data storage structure CAP may be formed on the upper conductive patterns 170, by sequentially forming a first electrode 181, an information storage dielectric 185, and a second electrode 182.

As set forth above, by recessing a barrier layer of a contact structure, and then forming an air gap on the recessed barrier layer, various semiconductor devices exhibiting improved electrical characteristics and greater performance reliability may be obtained.

While example embodiments have been shown and described above, it will be apparent to those skilled in the art that modifications and variations may be made to same without departing from the scope of the inventive concept as defined by the appended claims.

What is claimed is:

1. A semiconductor device, comprising:
 a substrate including an active region, the active region including a first region and a second region;
 a bitline extending in a first direction on the substrate and electrically connected to the first region of the active region;
 a spacer structure disposed on a side surface of the bitline;
 a contact structure disposed on a side surface of the spacer structure and electrically connected to the second region of the active region; and
 a data storage structure disposed on the contact structure and electrically connected to the contact structure,
 wherein the contact structure includes:
  a conductive contact layer including a first portion and a second portion disposed on the first portion;
  a barrier layer surrounding the first portion of the conductive contact layer; and
  an air gap surrounding the second portion of the conductive contact layer.

2. The semiconductor device of claim 1, wherein the air gap is disposed on the barrier layer between the second portion of the conductive contact layer and the spacer structure.

3. The semiconductor device of claim 1, further comprising:
 an upper conductive pattern disposed on the contact structure and including a first protruding portion extending between the spacer structure and the second portion of the conductive contact layer and contacting an upper region of a first side surface of the second portion of the conductive contact layer, wherein the first side surface of the second portion of the conductive contact layer faces the spacer structure.

4. The semiconductor device of claim 3, further comprising:
 a device separation region defining the active region in the substrate;
 a word line structure crossing between the first region and the second region of the active region and extending into the device separation region;
 an insulating fence vertically overlapping the word line structure and disposed on a side surface of the contact structure; and
 a separation insulating pattern penetrating the upper conductive pattern to contact the contact structure and the insulating fence.

5. The semiconductor device of claim 4, wherein the air gap is disposed on the barrier layer between the second portion of the conductive contact layer and the insulating fence.

6. The semiconductor device of claim 4, wherein the upper conductive pattern further comprises:
 a second protruding portion extending between the insulating fence and the second portion of the conductive contact layer to contact an upper region of a second side surface of the second portion of the conductive contact layer, wherein the second side surface of the second portion of the conductive contact layer faces the insulating fence.

7. The semiconductor device of claim 4, wherein an upper surface of the barrier layer is at a level lower than that of a lower end of the separation insulating pattern.

8. The semiconductor device of claim 1, wherein the spacer structure includes an air gap spacer.

9. The semiconductor device of claim 8, wherein the spacer structure further includes a first spacer between the air gap spacer and the air gap.

10. The semiconductor device of claim 9, wherein the spacer structure further includes a second spacer between the air gap spacer and the bitline.

11. The semiconductor device of claim 1, further comprising:
 a conductive pattern between the second region of the active region and the contact structure; and a metal-semiconductor compound layer between the conductive pattern and the contact structure.

12. A semiconductor device, comprising:
a substrate including an active region;
a first bitline extending in a first direction on the substrate and including a first side surface;
a second bitline extending in the first direction and including a second side surface facing the first side surface of the first bitline;
a first spacer structure covering the first side surface of the first bitline;
a second spacer structure covering the second side surface of the second bitline;
a contact structure disposed between the first spacer structure and the second spacer structure and electrically connected to a portion of the active region; and
a data storage structure disposed on the contact structure and electrically connected to the contact structure,
wherein the contact structure includes:
a conductive contact layer;
a barrier layer surrounding a lower surface and lower regions of side surfaces of the conductive contact layer, and including a recessed upper surface, wherein the recessed upper surface is recessed to a level lower than that of an upper surface of the conductive contact layer; and
an air gap disposed on the recessed upper surface of the barrier layer and surrounding upper regions of the side surfaces of the conductive contact layer.

13. The semiconductor device of claim 12, further comprising:
an upper conductive pattern disposed on the contact structure, wherein the upper conductive pattern includes a protruding portion extending between the first spacer structure and the conductive contact layer.

14. The semiconductor device of claim 13, further comprising:
a separation insulating pattern penetrating the upper conductive pattern to contact the conductive contact layer and the second spacer structure.

15. The semiconductor device of claim 14, wherein an upper portion of the air gap is capped by the protruding portion of the upper conductive pattern and the separation insulating pattern.

16. The semiconductor device of claim 14, wherein the recessed upper surface of the barrier layer is at a level lower than that of a lower end of the separation insulating pattern.

17. The semiconductor device of claim 12, wherein the air gap is disposed between the conductive contact layer and the first spacer structure and between the conductive contact layer and the second spacer structure.

18. A semiconductor device, comprising:
a substrate including an active region, wherein the active region includes a first impurity region and a second impurity region separate from the first impurity region;
a word line structure crossing the active region on the substrate and extending in a first direction;
a bitline disposed on the word line structure, extending in a second direction crossing the first direction, and electrically connected to the first impurity region of the active region;
a spacer structure covering a side surface of the bitline;
a conductive contact layer electrically connected to the second impurity region of the active region on a first region of a side surface of the spacer structure;
an insulating fence disposed on a second region of the side surface of the spacer structure, wherein the insulating fence includes a side surface facing the conductive contact layer;
a barrier layer surrounding a lower region of a lower surface and side surfaces of the conductive contact layer, wherein the barrier layer includes an upper surface recessed to a level lower than that of an upper surface of the conductive contact layer to form a recessed upper surface of the barrier layer;
a first air gap disposed on the recessed upper surface of the barrier layer, surrounding upper regions of the side surfaces of the conductive contact layer, disposed between the conductive contact layer and the spacer structure, and disposed between the conductive contact layer and the insulating fence;
an upper conductive pattern capping an upper portion of the first air gap and contacting the upper surface of the conductive contact layer; and
a data storage structure disposed on the upper conductive pattern and electrically connected to the upper conductive pattern.

19. The semiconductor device of claim 18, wherein the upper conductive pattern includes a protruding portion contacting the upper surface of the conductive contact layer toward the first air gap, and further contacting a portion of the upper regions of the side surfaces of the conductive contact layer.

20. The semiconductor device of claim 18, wherein the substrate includes a memory cell array region and a peripheral region including a peripheral active region, and
the semiconductor device further comprises:
a peripheral gate structure on the peripheral active region; and
a peripheral contact structure on a side surface of the peripheral gate structure and electrically connected to the peripheral active region,
wherein the peripheral contact structure includes:
a peripheral conductive contact layer including a first portion and a second portion disposed on the first portion;
a peripheral barrier layer surrounding the first portion of the peripheral conductive contact layer; and
a second air gap surrounding the second portion of the peripheral conductive contact layer.

* * * * *